United States Patent
Morishita et al.

(10) Patent No.: US 6,614,087 B1
(45) Date of Patent: Sep. 2, 2003

(54) SEMICONDUCTOR DEVICE

(75) Inventors: Kazuhiro Morishita, Fukuoka (JP); Katsumi Satoh, Tokyo (JP); Noritoshi Hirano, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/544,290

(22) Filed: Apr. 6, 2000

(30) Foreign Application Priority Data

Oct. 27, 1999 (JP) .......................... P11-305303

(51) Int. Cl.$^7$ .............................................. H01L 31/06
(52) U.S. Cl. ................. 257/461; 257/463; 257/464; 257/470; 257/509; 257/548; 257/549
(58) Field of Search ................. 438/203–208, 438/234–237; 257/242, 461, 463, 464, 470, 509, 548, 549, 550, 927, 929

(56) References Cited

U.S. PATENT DOCUMENTS

| 4,038,106 A | 7/1977 | Kawamoto |
| 4,101,920 A | 7/1978 | Nagasawa et al. |
| 4,402,001 A | * 8/1983 | Momma et al. ............... 357/38 |
| 4,775,883 A | * 10/1988 | Borchert et al. ............... 357/89 |
| 4,951,109 A | 8/1990 | Bechteler et al. |
| 5,032,540 A | 7/1991 | Follegot |
| 5,977,611 A | * 11/1999 | Sittig et al. .................. 257/603 |

FOREIGN PATENT DOCUMENTS

| EP | 0 351 677 | 1/1990 |
| EP | 0 749 166 | 12/1996 |
| GB | 1 494 905 | 12/1977 |

* cited by examiner

*Primary Examiner*—Long Pham
*Assistant Examiner*—Wai-Sing Louie
(74) *Attorney, Agent, or Firm*—Oblon, Spivak, McClelland, Maier & Neustadt, P.C.

(57) ABSTRACT

An object is to provide a semiconductor device which is free from such voltage oscillation as may cause malfunction of peripheral equipment. In a semiconductor device having a pin structure, the impurity concentration gradient in an n$^+$ layer (103) serving as a buffer layer is set equal to or less than $2\times10^{18}\text{cm}^{-4}$. Then, when a reverse bias voltage is applied and a depletion layer reaches the n$^+$ layer (103), the expansion of the depletion layer is prevented from rapidly stopping and the voltage oscillation can be suppressed.

12 Claims, 9 Drawing Sheets

SEMICONDUCTOR DEVICE

BACKGROUND OF THE INVENTION

1. Field of the Invention

The present invention relates to semiconductor devices having a pin structure, such as diodes, transistors, thyristors, etc.

2. Description of the Background Art

Figure 15A:
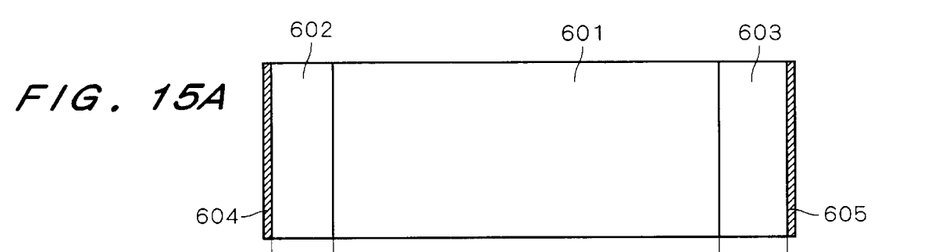
FIG. 15A is a sectional view showing the structure of a convention diode.
Figure 15B:
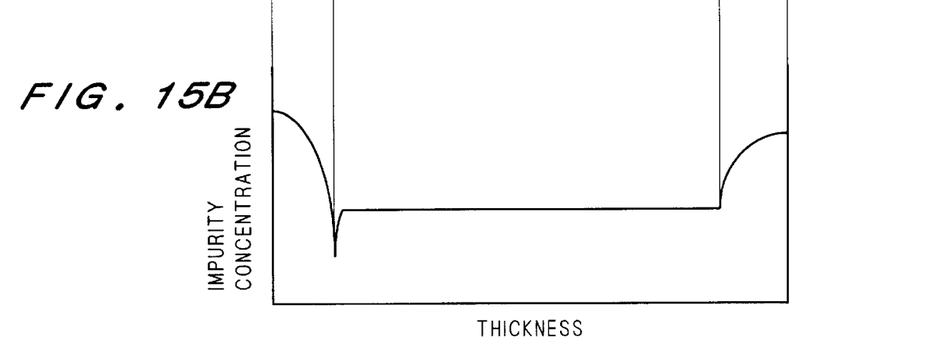
FIG. 15B shows a concentration profile of the convention diode.

FIGS. 15A, 15B show the structure of a conventional pin diode, where FIG. 15A shows its cross section and FIG. 15B shows its impurity concentration profile. The n$^-$-type semiconductor substrate 601 mainly composed of silicon, for example, has a player 602 on one of its main surfaces (on the left in the drawing) and an n$^+$ layer 603 on the other main surface (on the right in the drawing). For example, the player 602 contains boron or gallium as an impurity and the n$^+$ layer 603 contains phosphorus, which are obtained by diffusing the impurity to a given depth by thermal treatment. The player 602 and the n$^+$ layer 603 respectively have an anode electrode 604 and a cathode electrode 605 made of an electrically low resistant metal on the opposite sides to the n$^-$-type semiconductor substrate 601.

The impurity in the n$^-$-type semiconductor substrate 601 is almost uniformly distributed with a very small impurity concentration gradient. Since the player 602 and the n$^+$ layer 603 are formed by applying impurity diffusion to the two main surfaces of the n$^-$-type semiconductor substrate 601, the impurity concentration in each layer has an impurity concentration gradient decreasing toward the n$^-$-type semiconductor substrate 601. For example, the n$^+$ layer 603 has an impurity concentration gradient of about $4 \times 10^{18} \text{cm}^{-4}$. The impurity concentration gradient is given as a value obtained by dividing the difference between a first concentration that is 90% of the maximum value of the impurity concentration in the n$^+$ layer 603 and a second concentration that is 50% of the maximum value by the distance from the position having the first concentration to the position having the second concentration.

Generally, when a reverse bias is applied to a diode having a pn junction in which a current is flowing in the forward direction by instantaneously switching an external circuit, a large reverse current transiently flows only in a certain period. This is caused by the accumulation of minority carriers in the diode, where the current does not immediately recover in the reverse direction even though it once reaches zero. This reverse current lasts until the minority carriers remaining as excess carriers in the vicinity of the junction decrease below a certain concentration and a depletion layer is established.

When a depletion layer is established, it starts supporting the reverse voltage, and the reverse voltage gradually increases and the reverse current gradually decreases as the depletion layer expands. Then the device voltage becomes steady equal to the voltage applied as the reverse bias and the reverse recovery operation is thus completed. The reverse current flowing in the reverse recovery operation decreases at a current decreasing rate that is determined by the reverse bias value and the inductance of the external circuit.

In the diode shown in FIG. 15, a center of carrier recombination is formed by proton irradiation etc. in the vicinity of the pn junction formed by the player 602 and the n$^-$-type semiconductor substrate 601 so as to locally shorten the lifetime in the vicinity of the pn junction, thus providing a characteristic with lower forward voltage, smaller reverse recovery current, and high di/dt tolerance. The entirety of the n$^-$-type semiconductor substrate 601 is subjected to diffusion of heavy metal, irradiation of electron beam etc. to set the carrier lifetime short.

Figure 16:
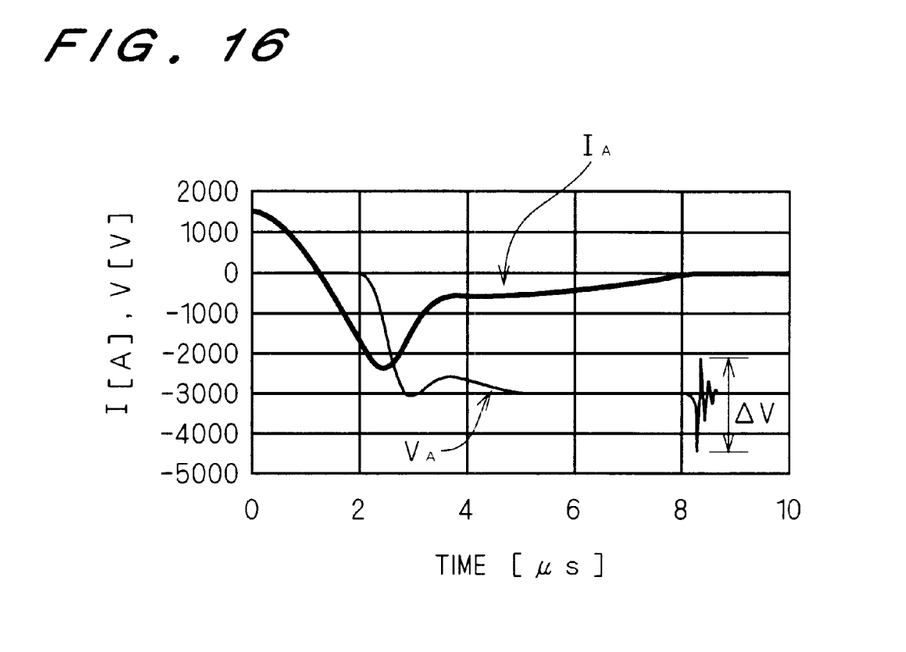
FIG. 16 is a graph showing the operation of the conventional diode.

However, when the reverse bias voltage is high, the applied voltage of the diode rapidly oscillates in the vicinity of completion of the reverse recovery operation, which generates such noise as may cause malfunction of the peripheral electric equipment. FIG. 16 is a graph showing the time variation in voltage $V_A$ and current $I_A$ during the reverse recovery operation of the diode shown in FIG. 15, where the time at which the forward bias is switched to the reverse bias by an external circuit is set as zero. As can be seen from the graph, the current of the diode becomes steady zero when about 8 µs passed after the switching and a voltage oscillation having an amplitude $\Delta V$ exceeding 2000 V occurs immediately after that.

It is supposed that such voltage oscillation is caused by resonance of an LCR series circuit formed by the diode and external circuit. The LCR series circuit is formed of a capacitance component C defined by the depletion layer and excess carriers of the diode as parameters, a resistance component R defined by the applied voltage and leakage current of the diode and the recombination current of the excess carriers as parameters, and the inductance component L of the external circuit.

The capacitance component C and the resistance component R of the diode change with time. Especially, the resistance component R rapidly changes when the excess carriers outside the depletion layer disappear. Then the resonance condition of the LCR circuit is reached and the voltage will oscillate as shown in FIG. 16. When the depletion layer reaches the n$^+$ layer 603, the capacitance component C rapidly changes, which may trigger the voltage oscillation.

Such voltage oscillation can occur not only in diodes but also in GCT (gate controlled turn-off) thyristors with rapid switching rate when the voltage rises in turn-off operation. Such voltage oscillation is undesired because it causes such noise as may cause malfunction of the peripheral electric equipment.

For example, Japanese Patent Laying-open No.62-115880 discloses a technique for controlling the semiconductor layer and concentration to improve the waveform in reverse recovery operation.

SUMMARY OF THE INVENTION

A first aspect of the present invention is directed to a semiconductor device comprising a first semiconductor layer of a first conductivity type, a second semiconductor layer of a second conductivity type, and a semiconductor substrate which is interposed between the first semiconductor layer and the second semiconductor layer and has the second conductivity type with an impurity concentration lower than that in the second semiconductor layer. According to the invention, in the semiconductor device, the second semiconductor layer has an impurity concentration decreasing toward the semiconductor substrate, and the impurity concentration in the second semiconductor layer decreases from 90% of its maximum value to 50% thereof at an impurity concentration gradient equal to or less than $2 \times 10^{18} \text{cm}^{-4}$.

Preferably, according to a second aspect of the invention, in the semiconductor device, the maximum value of the impurity concentration in the second semiconductor layer is not more than $5 \times 10^{15} \text{cm}^{-3}$.

Preferably, according to a third aspect of the invention, the semiconductor device further comprises a third semiconductor layer of the second conductivity type formed so that the second semiconductor layer is sandwiched between the semiconductor substrate and the third semiconductor layer, and a metal electrode formed so that the third semiconductor layer is sandwiched between the second semiconductor layer and the metal electrode, wherein the third semiconductor layer has a surface impurity concentration of not less than $5\times10^{17} cm^{-3}$ on the side of the metal electrode.

A fourth aspect of the invention is directed to a semiconductor device comprising a first semiconductor layer of a first conductivity type, a second semiconductor layer of a second conductivity type, and a semiconductor substrate which is interposed between the first semiconductor layer and the second semiconductor layer and has the second conductivity type with an impurity concentration lower than that in the second semiconductor layer. According to the semiconductor device of the fourth aspect, in a region in which a depletion layer extends when a reverse bias is applied to pn junction between the first semiconductor layer and the semiconductor substrate, the ratio of the amount of impurity in the semiconductor substrate to the amount of impurity in the first semiconductor layer is not more than 2/3.

Preferably, according to a fifth aspect of the invention, in the semiconductor device, in the region in which the depletion layer extends, the ratio of the amount of impurity in the second semiconductor layer to the amount of impurity in the first semiconductor layer is not less than 1.

Preferably, according to a sixth aspect of the invention, in the semiconductor device, in the region in which the depletion layer extends, the ratio of the amount of impurity in the second semiconductor layer to the amount of impurity in the first semiconductor layer is not less than 3/2.

According to the semiconductor device of the first aspect of the invention, the second semiconductor layer has a gentle impurity concentration gradient, which suppresses rapid expansion of the depletion layer in reverse recovery operation of a diode having the pn junction formed by the first semiconductor layer and the semiconductor substrate and in turn-off operation of a transistor or a GCT thyristor having the pn junction. Accordingly, it is possible to suppress unwanted voltage variation in the above-mentioned operations, or generation of noise.

According to the semiconductor device of the second aspect of the invention, the impurity concentration gradient mentioned in the first aspect can be obtained easily.

According to the semiconductor device of the third aspect, while the maximum value of the impurity concentration in the second semiconductor layer can be reduced to readily obtain a favorable impurity concentration gradient, the presence of the third semiconductor layer having high impurity concentration provides good ohmic contact between the metal electrode and the second semiconductor layer.

According to the semiconductor device of the fourth aspect, the semiconductor device can be formed thinner to realize smaller on-state voltage.

According to the semiconductor device of the fifth aspect, it is possible to reduce the leakage current.

According to the semiconductor device of the sixth aspect, the leakage current can be 10 mA or smaller.

The present invention has been made to solve the problems described above, and an object of the present invention is to provide a semiconductor device in which oscillation of the applied voltage is small in the reverse recovery operation or turn-off operation.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1A:
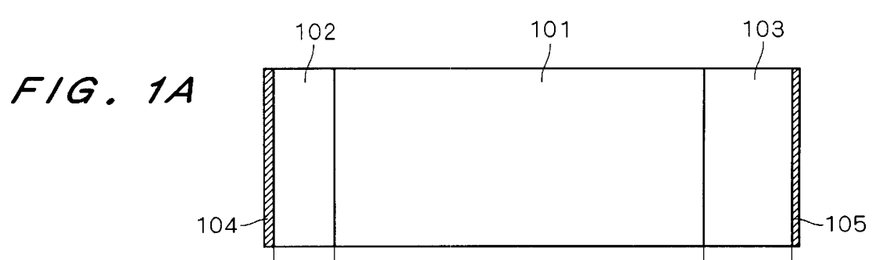
FIG. 1A shows a cross section of the structure of a diode according to a first preferred embodiment of the present invention.
Figure 1B:
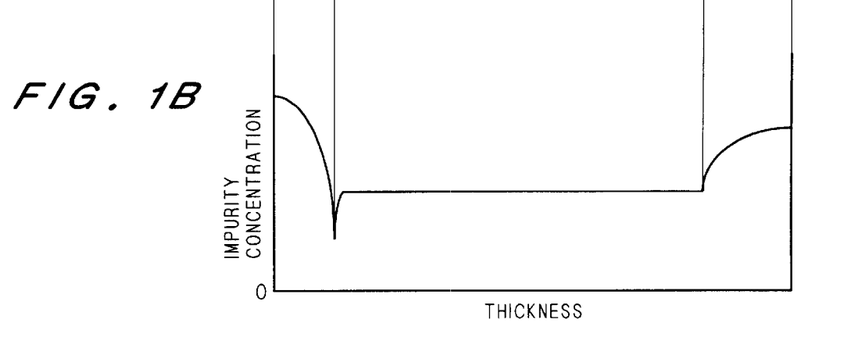
FIG. 1B shows a concentration profile of the diode according to the first preferred embodiment of the present invention.

FIGS. 1A, 1B show the structure of a pin diode according to a first preferred embodiment of the present invention, where FIG. 1A shows its cross section and FIG. 1B shows its impurity concentration profile. The $n^-$-type semiconductor substrate 101 mainly composed of silicon, for example, has a player 102 on one of its main surfaces (on the left in the drawing) and an $n^+$ layer 103 on the other main surface (on the right in the drawing). For example, the player 102 contains boron or gallium as an impurity and the $n^+$ layer 103 contains phosphorus, which are obtained by diffusing the impurity to a given depth by thermal treatment. The player. 102 and the $n^+$ layer 103 respectively have an anode electrode 104 and a cathode electrode 105 made of electrically low resistant metal on the opposite sides to the $n^-$-type semiconductor substrate 101.

The center of carrier recombination is formed by proton irradiation etc. in the vicinity of the pn junction formed by the player 102 and the $n^-$-type semiconductor substrate 101 so as to locally shorten the lifetime in the vicinity of the pn junction, thus providing a characteristic with low forward voltage, small reverse recovery current, and high di/dt tolerance. The entirety of the n⁻-type semiconductor substrate 101 is subjected to diffusion of heavy metal, irradiation of electron beam, etc. to shorten the carrier lifetime.

The impurity in the n⁻-type semiconductor substrate 101 is almost uniformly distributed with a very small impurity concentration gradient. Since the player 102 and the n⁺ layer 103 are formed by applying impurity diffusion to the two main surfaces of the n⁻-type semiconductor substrate 101, the impurity concentration in each layer has an impurity concentration gradient decreasing toward the n⁻-type semiconductor substrate 101.

Unlike that in the diode shown in FIG. 15, the n⁺ layer 103 has an impurity concentration gradient equal to or less than $2 \times 10^{18} cm^{-4}$.

Figure 2:
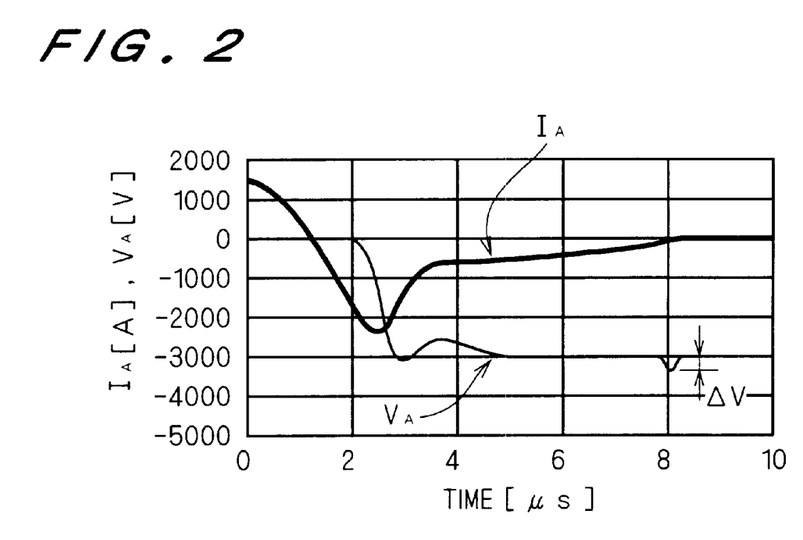
FIGS. 2 and 3 are graphs showing the operation of the diode of the first preferred embodiment of the invention.
Figure 3:
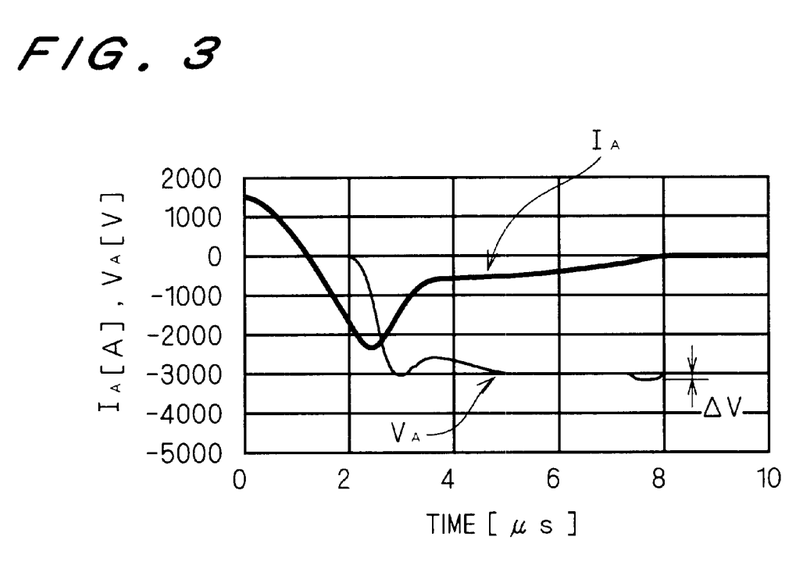

FIGS. 2 and 3 are graphs showing the time variation in the voltage $V_A$ and the current $I_A$ during the reverse recovery operation of the diode shown in FIGS. 1A, 1B, where the time at which the forward bias is switched to the reverse bias by an external circuit is set as zero. FIGS. 2 and 3 show examples in which the impurity concentration gradient in the n⁺ layer 103 is set to $2 \times 10^{18} cm^{-4}$ and $9 \times 10^{17} cm^{-4}$, respectively, where the distance between the anode electrode 104 and the cathode electrode 105, the total amount of impurity introduced in the n⁺ layer 103, and the thickness and impurity profile of the p layer 102 are set equal to those in the example shown in FIG. 16.

In both of FIGS. 2 and 3, the current of the diode becomes steady zero when about 8 μs passed after the switching, and a voltage oscillation occurs immediately after that. However, in FIG. 2, its amplitude ΔV is some hundreds of volts, which is largely reduced to about one-fifth as compared with that shown in FIG. 16. The amplitude ΔV is further reduced in FIG. 3. Since external circuitry is not susceptible to the noise when the amplitude ΔV is 500 V or lower, it is desired that the impurity concentration gradient in the n⁺ layer 103 is set to $2 \times 10^{18} cm^{-4}$ or lower.

Figure 4:
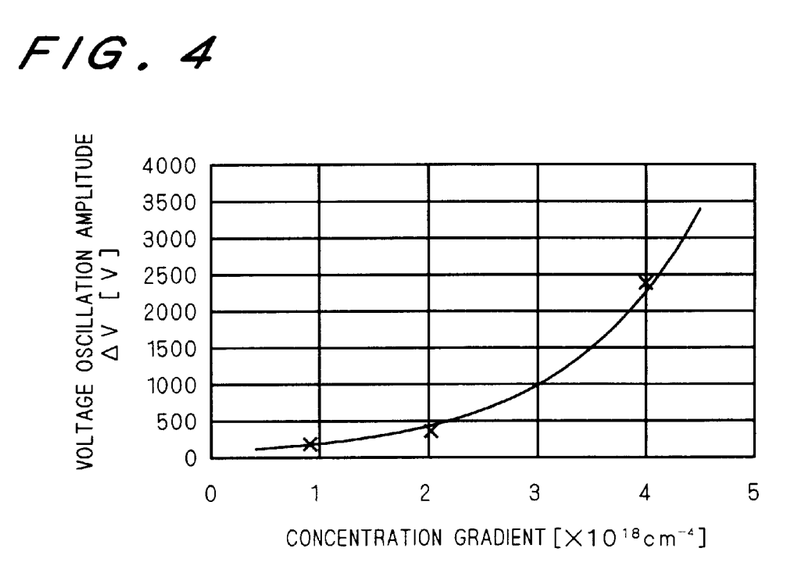
FIG. 4 is a graph used to explain the first preferred embodiment of the invention.

FIG. 4 is a graph showing the relation between the impurity concentration gradient in the n⁺ layer 103 and the amplitude, ΔV of the voltage oscillation in the reverse recovery operation, where X shows actual measurements. It can be seen from the graph that the voltage oscillation during the reverse recovery operation decreases as the impurity concentration gradient in the n⁺ layer 103 becomes gentler. The reason is considered as follows: when the depletion layer extending from the pn junction reaches the n⁺ layer 103 during the reverse recovery operation, the expansion of the depletion layer becomes less likely to stop rapidly as the impurity concentration gradient in the n⁺ layer 103 becomes smaller.

Usually, in the formation of the n⁺ layer 103, phosphorus or arsenic is applied to the n⁻-type semiconductor substrate 101 by ion implantation or thermal treatment at about 1000° C. and then diffused to a given depth by thermal treatment at high temperature of 1100° C. or higher. Hence, obtaining a gentler impurity concentration gradient requires applying the thermal treatment for a long time after, the introduction of impurity. Accordingly, when the total amount of impurity introduced in the n⁺ layer 103 is unchanged and the thickness of the n⁻-type semiconductor substrate 101 before formation of the player 102 and the n⁺ layer 103 and the thickness of the player 102 are fixed, the thickness of the n⁺ layer 103 becomes larger as the impurity concentration gradient becomes smaller. Hence, after the formation of the player 102 and the n⁺ layer 103, the n⁻-type semiconductor substrate 101 forms thinner as the impurity concentration gradient becomes smaller. Thus, when the distance between the anode electrode 104 and the cathode electrode 105, which is approximately equal to the thickness of the n⁻-type semiconductor substrate 101 before formation of the player 102 and the n⁺ layer 103, the total amount of impurity introduced in the n⁺ layer 103, and the thickness and impurity profile of the player 102 are fixed, the n⁻-type semiconductor substrate 101 becomes thinner as the impurity concentration gradient becomes smaller, and then the depletion layer reaches the n⁺ layer 103 in shorter time. This is considered to be an indirect cause of the fact that the voltage oscillation during the reverse recovery operation can be alleviated by setting the impurity concentration gradient in the n⁺ layer 103 smaller.

Second Preferred Embodiment

Figure 5:
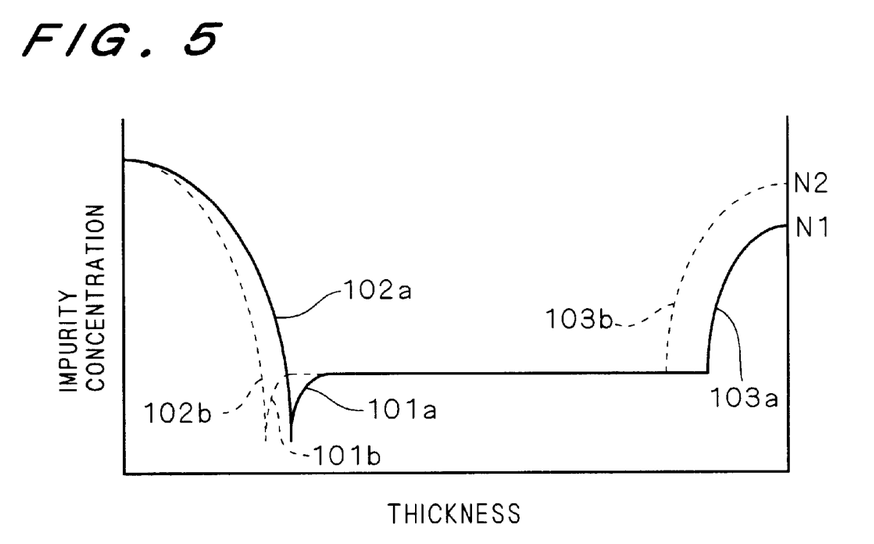
FIG. 5 shows concentration profiles used to explain a second preferred embodiment of the invention.

FIG. 5 shows impurity concentration profiles of pin diodes, which correspond to FIG. 15(b) and FIG. 1(b). In the diagram, the lines 101a and 101b represent the impurity concentration profiles in the n⁻-type semiconductor substrate 101, 102a and 102b represent those in the player 102, and 103a and 103b represent those in the n⁺ layer 103.

The graph 101a, 102a, and 103a and the graph 101b, 102b, and 103b show the impurity concentration profiles in pin diodes constructed separately. In the former and latter diodes, the surface impurity concentration in the n⁺ layer 103 at the most distant position from the n⁻-type semiconductor substrate 101 is set to N1 and N2 (N1<N2), respectively.

As stated before, in the formation of the n⁺ layer 103, usually, phosphorus or arsenic is applied to the n⁻-type semiconductor substrate 101 by ion implantation or thermal treatment at about 1000° C. and diffused to a given depth by thermal treatment at high temperature of 1100° C. or higher. Accordingly, when obtaining the impurity concentration gradient in a certain n⁺ layer 103, the n⁺ layer 103 forms thinner in the diode having the n⁺ layer 103 with the lower surface impurity concentration N1 than in the diode having the n⁺ layer 103 with the higher surface impurity concentration N2. Hence, to form the n⁺ layer 103 in a shorter time, it is desirable to set the surface impurity concentration lower.

Figure 6:
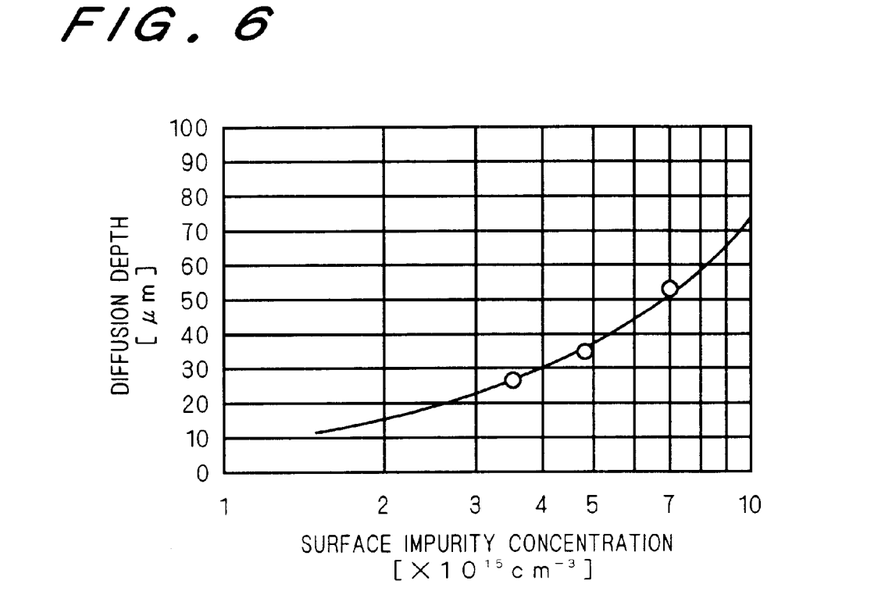
FIGS. 6 and 7 are graphs used to explain the second preferred embodiment of the invention.

Needless to say, the above-described trend applies also to the pin diode of the first preferred embodiment. FIG. 6 is a graph showing the relation between the surface impurity concentration of the n⁺ layer 103 and the thickness of the n⁺ layer 103 or the diffusion depth, which shows an example in which the impurity concentration gradient in the n⁺ layer 103 is set to $2 \times 10^{18} cm^{-4}$. In the diagram, ○ shows actual measurements. While the diffusion depth is about 40 μm when the surface impurity concentration is $5 \times 10^{15} cm^{-3}$, the diffusion depth of about 75 μm is required when the surface impurity concentration is $1 \times 10^{16} cm^{-3}$. For the thermal treatment time required for diffusion, while about 25 hours are required at a diffusion temperature of 1250° C. for the 40 μm-depth diffusion, about 85 hours are required for the 75 μm-depth diffusion. Considering the fact that the workers live in one-day or twenty-four-hours rhythm, it is desirable to set the diffusion time to about 24 hours. Hence, when the impurity concentration gradient in the n⁺ layer 103 is not more than $2 \times 10^{18} cm^{-4}$ as in the case of the diode of the first preferred embodiment, it is desired that the surface impurity concentration of the n⁺ layer 103 is not more than $5 \times 10^{15} cm^{-3}$ and the diffusion depth is not more than 40 μm.

Figure 7:
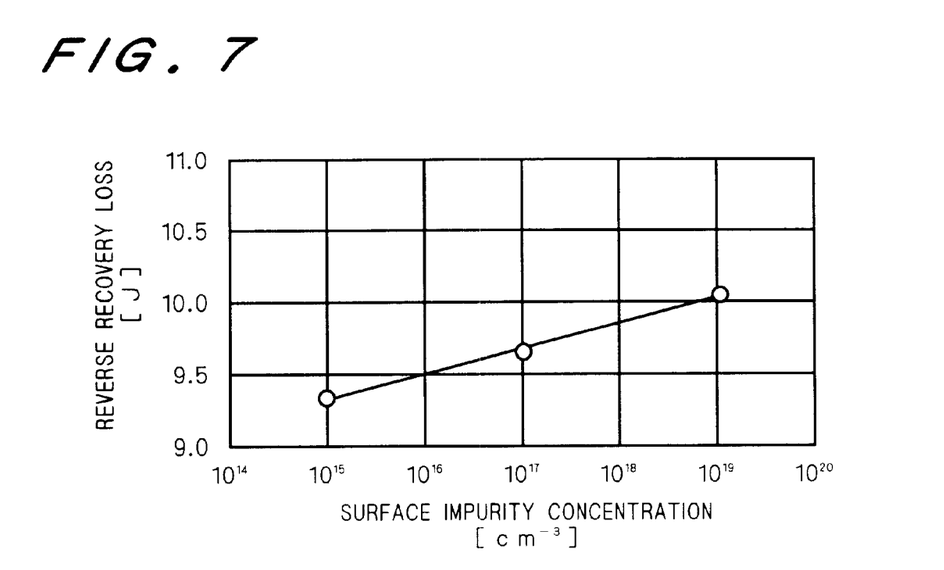

FIG. 7 is a graph showing the relation between the surface impurity concentration of the n⁺ layer 103 and the reverse recovery loss for each switching. In the diagram, ○ shows actual measurements. As can be seen from the graph, reducing the surface impurity concentration of the n+ layer 103 is desired also in respect of suppression of the loss.

Third Preferred Embodiment

Figure 8:
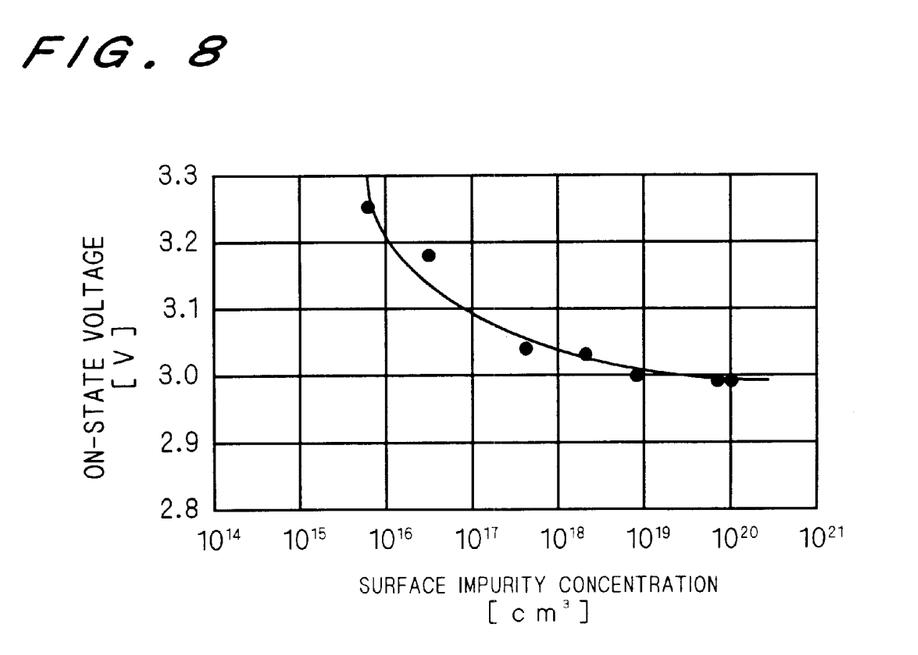
FIG. 8 is a graph used to explain a third preferred embodiment of the invention.

FIG. 8 is a graph showing the relation between the impurity concentration in n-type semiconductor in a pin diode at a position in contact with the cathode electrode, or the surface impurity concentration, and the on-state voltage of the diode, where ● represents actual measurements. In the example, the n-type semiconductor is mainly composed of silicon and the cathode electrode is mainly composed of aluminum. While the on-state voltage is almost constant at 3.0 V when the surface impurity concentration of the n-type semiconductor in contact with the cathode electrode is $5 \times 10^{17} cm^{-3}$ or higher, the on-state voltage sharply increases with a decrease in the surface impurity concentration when the surface impurity concentration is lower than $5 \times 10^{17} cm^{-3}$. It is supposed that this variation depends on whether ohmic contact can be favorably made between the cathode electrode and the n-type semiconductor in contact with it. Accordingly, it is desired that the surface impurity concentration of the n-type semiconductor in a position in contact with the cathode electrode is set equal to or more than $5 \times 10^{17} cm^{-3}$ to obtain good ohmic contact.

However, if the cathode electrode 105 is in direct contact with the n+ layer 103 having a low surface impurity concentration of $5 \times 10^{15} cm^{-3}$ or lower as described in the second preferred embodiment, it is difficult to make good ohmic contact.

Figure 9:
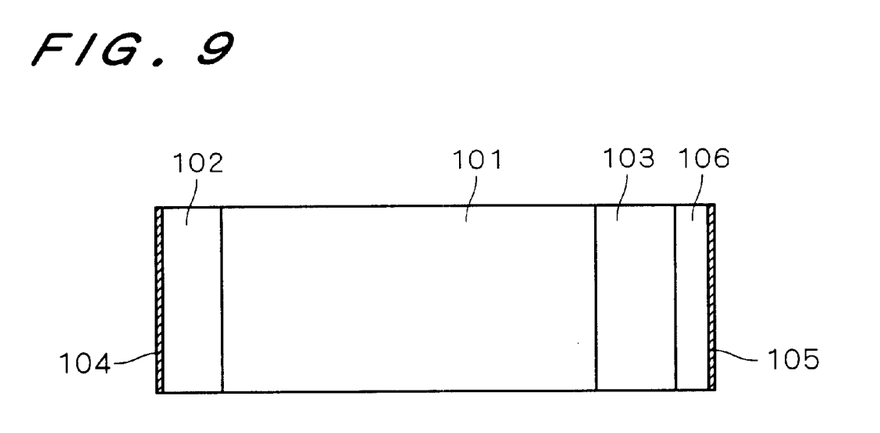
FIG. 9 is a sectional view showing the structure of a diode according to the third preferred embodiment of the invention.

FIG. 9 is a sectional view showing the structure of a pin diode according to a third preferred embodiment of the present invention. In this structure, an n++ layer 106 is interposed between the n+ layer 103 and the cathode electrode 105 in the pin diode of the first preferred embodiment of the invention (see FIG. 1(a)). Thus, the value of the impurity concentration in the n+ layer 103 at the most distant position from the n−-type semiconductor substrate 101, or at the closest position to the n++ layer 106, i.e. the surface impurity concentration of the n+ layer 103, can be set to $5 \times 10^{15} cm^{-3}$ or lower while the surface impurity concentration of the n++ layer 106 is set to $5 \times 10^{17} cm^{-3}$ or higher, and then the impurity concentration gradient in the n+ layer 103 can easily be set to $2 \times 10^{18} cm^{-4}$ or lower while obtaining good ohmic contact with the cathode electrode 105. This provides a pin diode in which the voltage amplitude appearing after the completion of the reverse recovery operation is reduced and the on-voltage is small.

Fourth Preferred Embodiment

Figure 10A:
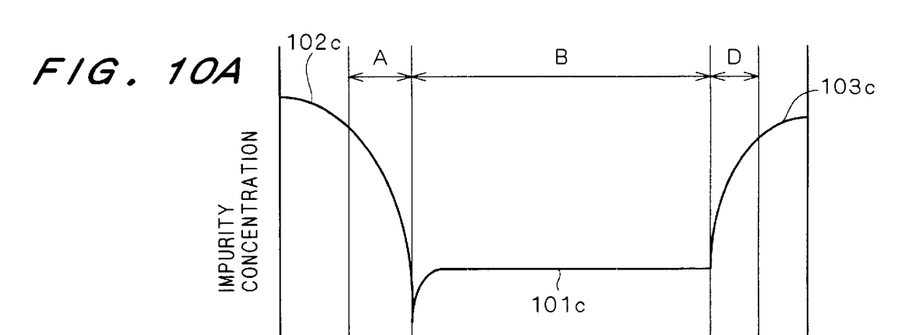
FIGS. 10A, 10B show a concentration profile and electric field strength profiles, respectively, used to explain a fourth preferred embodiment of the invention.
Figure 10B:
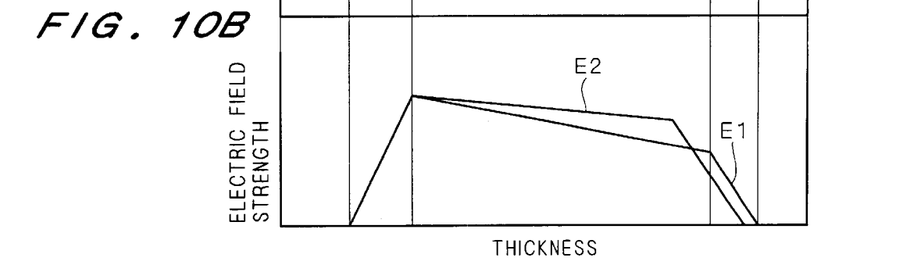

FIGS. 10A, 10B show diagrams used to explain this preferred embodiment, where FIG. 10A shows the impurity concentration profile in a pin diode in a manner corresponding to FIG. 15B and FIG. 1B, and the graph 101c, 102c, and 103c shows the impurity concentration profile in the n−-type semiconductor substrate 101, the player 102, and the n+ layer 103, respectively. FIG. 10B shows electric field strength profiles in the pin diode exhibited when a reverse bias is applied and the rated voltage is kept, where, particularly, the graph E1 is aligned in position with FIG. 10A.

When a reverse bias is applied to a pin diode, the depletion layer extending from the pn junction between the n−-type semiconductor substrate 101 and the player 102 reaches the n+ layer 103, and the electric field strength E1 is large in the depletion layer. In FIG. 10, the depletion layer extends over the region A, region B, and region D.

The region B extends in the entirety of the n−-type semiconductor substrate 101, the region A partially penetrates the player 102 from the position in contact with the n−-type semiconductor substrate 101, and the region D partially penetrates the n+ layer 103 from the position in contact with the n−-type semiconductor substrate 101. The amount of impurity in the region A (hereinafter the character A is attached thereto) is not more than the sum of the amount of impurity in the region B (hereinafter the character B is attached thereto) and the amount of impurity in the region D (hereinafter the character D is attached thereto). The end of the region A away from the n−-type semiconductor substrate 101 is determined by the amount of impurity A and the curve 102c, and the end of the region D away from the n−-type semiconductor substrate 101 is determined by the amount of impurity D and the curve 103c.

In large-power devices manufactured without using many fine processes to realize low manufacture cost, it is desired that the rated breakdown voltage is not reduced even if fine particles etc. attach to it. For this purpose, the player 102 is formed much thicker than those in other types of device, which is set to about 100 μm. In such devices, while the rated voltage is kept, the amount of impurity A is about half of the total amount of impurity in the player 102 and the amount of impurity D is also about half of the amount of impurity in the n+ layer 103.

In FIG. 10B, the graphs E1 and E2 show the electric field strengths in examples in which the ratio of the amount of impurity B to the amount of impurity A, i.e. the ratio B/A, is 1 and 2/3, respectively. As compared with the former, the electric field strength in the latter bends in a position closer to the player 102, and the pin diode can be formed thinner to reduce the on-state voltage.

Figure 11:
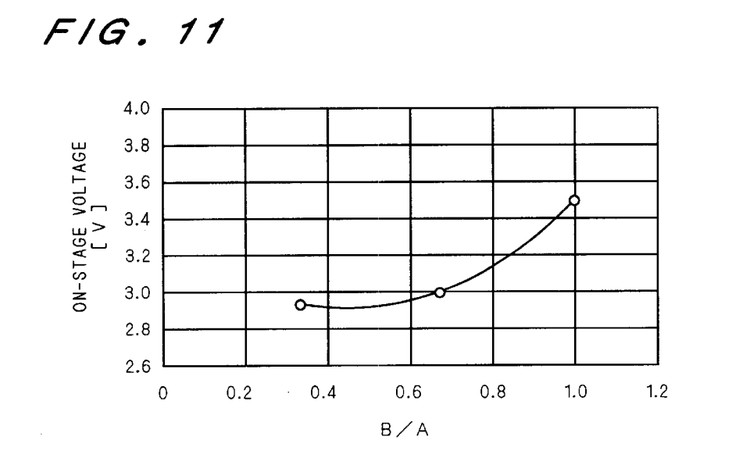
FIGS. 11 and 12 are graphs used to explain the fourth preferred embodiment of the invention.

FIG. 11 is a graph showing results of simulation about the relation between the ratio B/A and the on-state voltage, where the on-state voltage was simulated with B/A=1/3, 2/3, and 3/3. When B/A≦2/3, the on-state voltage takes an almost constant value of about 3V independently of the ratio B/A, but when B/A>2/3, the on-state voltage sharply increases as the ratio B/A increases. Hence it is desirable to set the ratio B/A to 2/3 or smaller.

Figure 12:
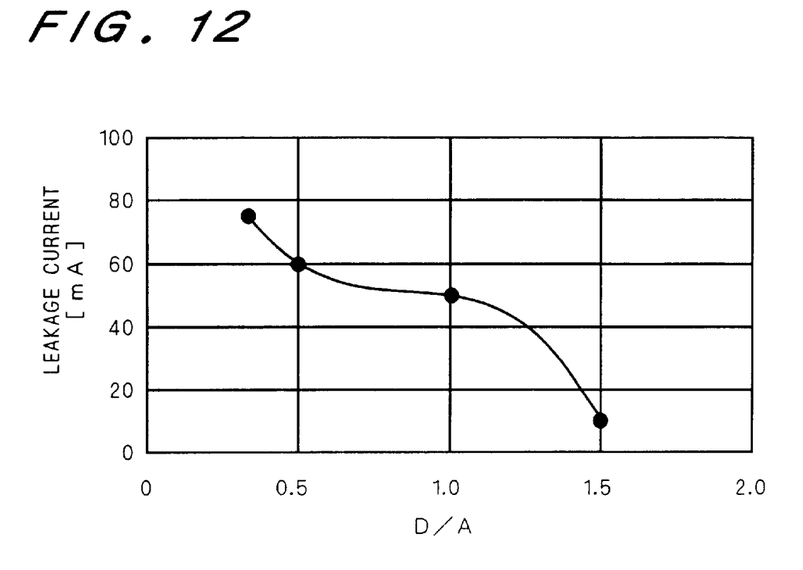

FIG. 12 is a graph showing results of simulation about the relation between the ratio D/A of the amount of impurity D to the amount of impurity A and the leakage current, where the ratio B/A is set to 2/3. The leakage current was simulated with D/A=1/3, 1/2, 2/2, and 3/2. Since the leakage current sharply decreases as the D/A increases when D/A≧2/2, it is desirable to set the ratio D/A to 1 or larger. Further, since the adverse effect on the device operation can be neglected generally when the leakage current is 10 mA or lower, it is more desirable to set D/A≧3/2.

Modifications of the Preferred Embodiments

Although the preferred embodiments above have shown diodes having the pin structure by way of example, the invention can be applied also to other semiconductor devices having the pin structure.

Figure 13:
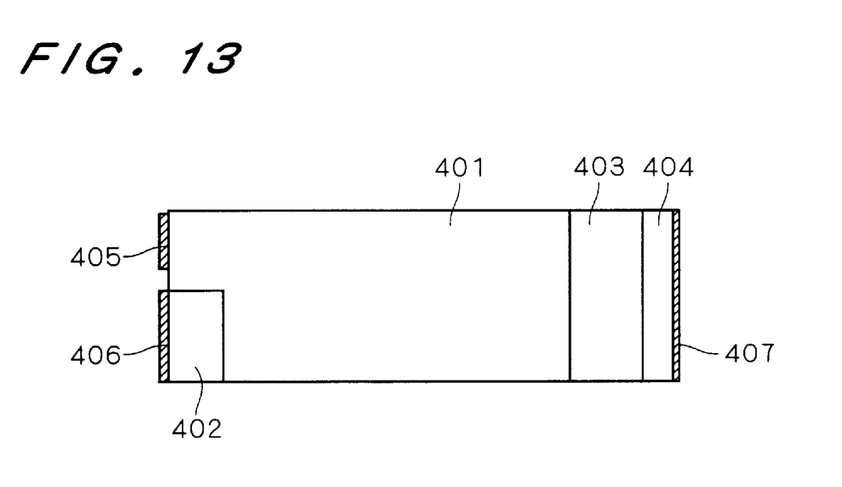
FIGS. 13 and 14 are sectional views showing structures of modifications of the invention.

FIG. 13 is a sectional view showing the structure of a transistor having the pin structure. The transistor has a player 402, an n+ layer 403, an n−layer 401 interposed between the player 402 and the n+ layer 403, a p+ layer 404 formed so that the n+ layer 403 is sandwiched between it and the n− layer 401, an electrode 405 formed so that the n−layer 401 is sandwiched between it and the n+ layer 403, an electrode 406 formed so that the player 402 is sandwiched between it and the n⁻ layer 401, and an electrode 407 formed so that the p⁺ layer 404 is sandwiched between it and the n⁺ layer 403. The electrodes 405, 406, and 407 function as the base electrode, emitter electrode, and collector electrode, respectively.

The transistor has a pin structure in the player 402, the n⁻ layer 401, and the n⁺ layer 403, to which the techniques described in the first to fourth preferred embodiments can be applied to suppress the voltage oscillation in turn-off operation.

Figure 14:
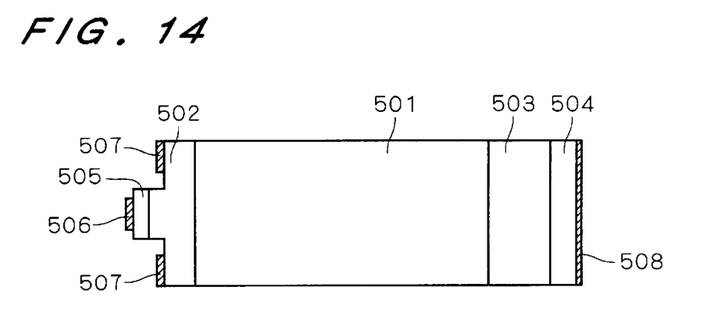

FIG. 14 is a sectional view showing the structure of a GCT thyristor having the pin structure. The GCT thyristor has a player 502, an n⁺ layer 503, an n⁻ layer 501 interposed between the player 502 and the n⁺ layer 503, a p⁺ layer 504 formed so that the n⁺ layer 503 is sandwiched between it and the n⁻ layer 501, an n layer 505 formed so that the player 502 is sandwiched between it and the n⁻ layer 501, an electrode 506 formed so that the n⁺ layer 505 is sandwiched between it and the player 502, an electrode 507 formed so that the player 502 is sandwiched between it and the n⁻ layer 501, and an electrode 508 formed so that the p⁺ layer 504 is sandwiched between it and the n⁺ layer 503. The electrodes 506, 507, and 508 function as the cathode electrode, gate electrode, and anode electrode, respectively. The thyristor has the pin structure in the player 502, the n⁻ layer 501, and the n⁺ layer 503, to which the techniques described in the first to fourth preferred embodiments can be applied to suppress the voltage oscillation in the reverse recovery operation.

While the invention has been described in detail, the foregoing description is in all aspects illustrative and not restrictive. It is understood the numerous other modifications and variations can be devised without departing from the scope of the invention.

What is claimed is:

1. A semiconductor device comprising a first semiconductor layer of a first conductivity type, a second semiconductor layer of a second conductivity type, and a semiconductor substrate which is interposed between said first semiconductor layer and said second semiconductor layer and has said second conductivity type with an impurity concentration lower than that in said second semiconductor layer, wherein said second semiconductor layer has an impurity concentration decreasing toward said semiconductor substrate, and said impurity concentration in said second semiconductor layer decreases from 90% of its maximum value to 50% thereof at an impurity concentration gradient equal to or less than $2 \times 10^{18} \text{cm}^{-4}$.

2. The semiconductor device according to claim 1, wherein said maximum value of said impurity concentration in said second semiconductor layer is not more than $5 \times 10^{15} \text{cm}^{-3}$.

3. The semiconductor device according to claim 2, further comprising a third semiconductor layer of said second conductivity type formed so that said second semiconductor layer is sandwiched between said semiconductor substrate and said third semiconductor layer, and a metal electrode formed so that said third semiconductor layer is sandwiched between said second semiconductor layer and said metal electrode, wherein said third semiconductor layer has a surface impurity concentration of not less than $5 \times 10^{17} \text{cm}^{-3}$ on the side of said metal electrode.

4. The semiconductor device according to claim 1, further comprising a third semiconductor layer having said first conductivity type and formed so that said second semiconductor layer is sandwiched between said semiconductor substrate and said third semiconductor layer.

5. The semiconductor device according to claim 4, further comprising three kinds of electrodes respectively connected to said semiconductor substrate, said first semiconductor layer, and said third semiconductor layer.

6. The semiconductor device according to claim 5, further comprising a fourth semiconductor layer having said second conductivity type and formed so that said first semiconductor layer is sandwiched between said semiconductor substrate and said fourth semiconductor layer, and three kinds of electrodes respectively connected to said first semiconductor layer, said third semiconductor layer, and said fourth semiconductor layer.

7. A semiconductor device comprising a first semiconductor layer of a first conductivity type, a second semiconductor layer of a second conductivity type, and a semiconductor substrate which is interposed between said first semiconductor layer and said second semiconductor layer and has said second conductivity type with an impurity concentration lower than that in said second semiconductor layer, wherein in a region in which a depletion layer extends when a reverse bias is applied to pn junction between said first semiconductor layer and said semiconductor substrate, the ratio of the amount of impurity in said semiconductor substrate to the amount of impurity in said first semiconductor layer is not more than 2/3.

8. The semiconductor device according to claim 7, wherein in said region in which the depletion layer extends, the ratio of the amount of impurity in said second semiconductor layer to the amount of impurity in said first semiconductor layer is not less than 1.

9. The semiconductor device according to claim 8, wherein in said region in which the depletion layer extends, the ratio off the amount of impurity in said second semiconductor layer to the amount of impurity in said first semiconductor layer is not less than 3/2.

10. The semiconductor device according to claim 7, further comprising a third semiconductor layer having said first conductivity type and formed so that said second semiconductor layer is sandwiched between said semiconductor substrate and said third semiconductor layer.

11. The semiconductor device according to claim 10, further comprising three kinds of electrodes respectively connected to said semiconductor substrate, said first semiconductor layer, and said third semiconductor layer.

12. The semiconductor device according to claim 10, further comprising a fourth semiconductor layer having said second conductivity type and formed so that said first semiconductor layer is sandwiched between said semiconductor substrate and said fourth semiconductor layer, and three kinds of electrodes respectively connected to said first semiconductor layer, said third semiconductor layer, and said fourth semiconductor layer.

* * * * *